United States Patent
Wang et al.

(10) Patent No.: US 10,923,677 B2
(45) Date of Patent: Feb. 16, 2021

(54) FILM STRUCTURE, DISPLAY DEVICE AND METHOD FOR FABRICATING THE FILM STRUCTURE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Yulin Wang, Beijing (CN); Huai Ting Shih, Beijing (CN); Lifang Song, Beijing (CN); Rui Peng, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 30 days.

(21) Appl. No.: 16/336,164

(22) PCT Filed: Jul. 6, 2018

(86) PCT No.: PCT/CN2018/094880
§ 371 (c)(1),
(2) Date: Mar. 25, 2019

(87) PCT Pub. No.: WO2019/042015
PCT Pub. Date: Mar. 7, 2019

(65) Prior Publication Data
US 2019/0229291 A1 Jul. 25, 2019
US 2020/0251681 A9 Aug. 6, 2020

(30) Foreign Application Priority Data
Aug. 28, 2017 (CN) .............................. 201710751104

(51) Int. Cl.
| | |
|---|---|
| H01L 51/52 | (2006.01) |
| H01L 51/56 | (2006.01) |
| H01L 27/32 | (2006.01) |
| H01L 51/00 | (2006.01) |

(52) U.S. Cl.
CPC .......... H01L 51/5253 (2013.01); H01L 51/56 (2013.01); H01L 27/3246 (2013.01);
(Continued)

(58) Field of Classification Search
CPC ......... H01L 2251/5338; H01L 27/3246; H01L 27/3258; H01L 51/0097; H01L 51/5246;
(Continued)

(56) References Cited

U.S. PATENT DOCUMENTS 6,222,315 B1    4/2001   Yoshizawa et al.
9,182,857 B2 *  11/2015  Nagata .................. G06F 3/0446
(Continued)

FOREIGN PATENT DOCUMENTS

CN    1971940 A      5/2007
CN    104091896 A    10/2014
(Continued)

OTHER PUBLICATIONS

PCT International Search Report, Application No. PCT/CN2018/094880, dated Oct. 8, 2018, 5 pages: with English translation.
(Continued)

*Primary Examiner* — Jaehwan Oh
(74) *Attorney, Agent, or Firm* — Armstrong Teasdale LLP

(57) ABSTRACT

The present disclosure provides a film structure, a display device, and a method for fabricating a film structure, and relates to the field of display technology. The present disclosure provides a first organic layer having a sloped edge on a substrate, a climbing angle between the sloped edge and the substrate is less than a breakable angle, and wherein the
(Continued)

breakable angle is an angle at which the first additional layer on the sloped edge of the first organic layer cracks or is about to crack.

9 Claims, 3 Drawing Sheets

(52) U.S. Cl.
CPC ...... *H01L 27/3258* (2013.01); *H01L 51/0097* (2013.01); *H01L 51/5256* (2013.01); *H01L 2251/5338* (2013.01)

(58) Field of Classification Search
CPC .. H01L 51/5253; H01L 51/5256; H01L 51/56
See application file for complete search history.

(56) References Cited

U.S. PATENT DOCUMENTS

| | | | |
|---|---|---|---|
| 2007/0114519 A1* | 5/2007 | Hayashi | H01L 51/5246 257/40 |
| 2009/0284144 A1* | 11/2009 | Fujioka | H01L 51/5228 313/504 |
| 2010/0244664 A1* | 9/2010 | Fujioka | H01L 27/3246 313/504 |
| 2013/0221361 A1* | 8/2013 | Yamazaki | H01L 27/3246 257/72 |
| 2016/0276624 A1* | 9/2016 | Wang | H01L 51/5253 |

FOREIGN PATENT DOCUMENTS

| | | |
|---|---|---|
| CN | 107359276 A | 11/2017 |
| CN | 207124211 U | 3/2018 |
| JP | 2007005189 A | 1/2007 |
| JP | 2012022877 A | 2/2012 |

OTHER PUBLICATIONS

PCT Written Opinion, Application No. PCT/CN2018/094880, dated Oct. 8, 2018, 7 pages.: with English translation of relevant part.
China First Office Action, Application No. 201710751104.X, dated Mar. 22, 2019, 18 pps.: with English translation.

* cited by examiner

… (1) …

FILM STRUCTURE, DISPLAY DEVICE AND METHOD FOR FABRICATING THE FILM STRUCTURE

CROSS REFERENCE TO RELATED APPLICATIONS

This patent application is a National Stage Entry of PCT/CN2018/094880 filed on Jul. 6, 2018, which claims the benefit and priority of Chinese Patent Application No. 201710751104.X filed on Aug. 28, 2017, the disclosures of which are hereby incorporated by reference herein in their entirety as part of the present application.

BACKGROUND

The present disclosure relates to the field of display technology, and in particular, to a film structure, a display device, and a method of fabricating a film structure.

OLED (Organic Light Emitting Diode) has many advantages such as active illumination, high brightness, high contrast, ultra-thin, low power consumption, flexibility, and wide operating temperature range and thus has become a next generation display technology with very competitive and promising future.

BRIEF DESCRIPTION

The present disclosure provides a film structure. The film structure includes a first organic layer on the substrate and a first additional layer on the first organic layer. Wherein the first organic layer has a sloped edge, and a climbing angle between the sloped edge and the substrate is less than a breakable angle. The breakable angle is an angle at which the first additional layer on the sloped edge of the first organic layer cracks or is about to crack.

In an embodiment, the breakable angle is about 35°.

In an embodiment, the first organic layer is a functional layer in a functional structure on the substrate or an encapsulation layer in an encapsulation structure for encapsulating the functional structure.

In an embodiment, the first additional layer includes a first inorganic layer.

In an embodiment, the first organic layer is a functional layer in the functional structure, the film structure further including at least one stack, consisting of a second organic layer and a second inorganic layer, on the first inorganic layer.

In an embodiment, the first organic layer is an encapsulation layer in the encapsulation structure, the encapsulation structure including at least one stack consisting of the first organic layer and the first inorganic layer.

In an embodiment, the first organic layer includes a planarization layer or a pixel defining layer.

In an embodiment, the structure further includes a protective layer disposed opposite to the substrate and an adhesive layer for bonding the protective layer to the substrate, and wherein the first organic layer is located between the substrate and the protective layer.

In an embodiment, the substrate is a rigid substrate or a flexible substrate.

The present disclosure also provides a display device including the above-described film structure.

The present disclosure also provides a method of fabricating a film structure. The method includes forming a first organic layer on the substrate, and forming a first additional layer on the first organic layer. Wherein the first organic layer has a sloped edge, and a climbing angle between the sloped edge and the substrate is less than a breakable angle. The breakable angle is an angle at which the first additional layer formed on the sloped edge of the first organic layer cracks or is about to crack.

In an embodiment, forming the first additional layer on the first organic layer includes forming a first inorganic layer on the first organic layer.

In an embodiment, the first organic layer is a functional layer in a functional structure on the substrate, the method further includes, after forming a first inorganic layer on the first organic layer, forming at least one stack, consisting of a second organic layer and a second inorganic layer, on the first inorganic layer.

In an embodiment, the first organic layer is an encapsulation layer in an encapsulation structure, forming a first organic layer on the substrate includes forming a second organic layer on the substrate, forming a second inorganic layer on the second organic layer, and forming a first organic layer on the second inorganic layer.

DETAILED DESCRIPTION

Figure 1:
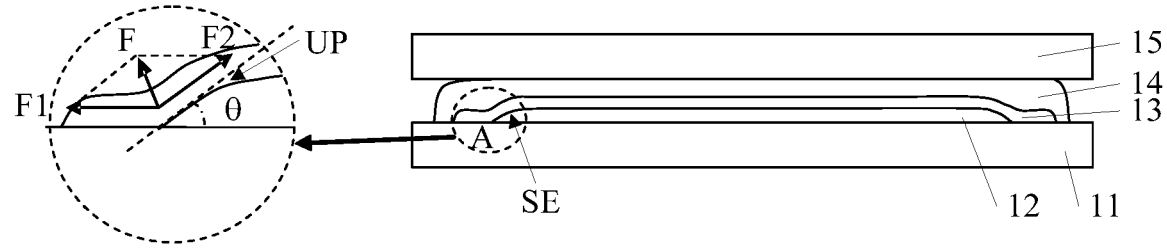
FIG. 1 shows one of schematic views of a film structure according to embodiments of the present disclosure.

In order to make the technical solutions and advantages of the embodiments of the present disclosure more comprehensible, the embodiments of the present disclosure are described below with reference to the accompanying drawings.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively.

For purposes of the description hereinafter, the terms "upper", "lower", "right", "left", "vertical", "horizontal", "top", "bottom", and derivatives thereof shall relate to the disclosure, as it is oriented in the drawing Figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In the OLED device, the thickness of the organic layer formed on the substrate is on the order of micrometers, and is limited by the formation process and material of the organic layer. The climbing (profile) angle of the upper surface of the organic layer and the substrate is relatively large.

When other films are deposited on the organic layer, since the climbing angle between the upper surface of the organic layer and the substrate is large, the film deposited on the organic layer is prone to crack at the corner position, affecting the OLED device's service life.

FIG. 1 which shows a schematic view of the film structure according to embodiments of the present disclosure will be referred to.

Embodiments of the present disclosure provide a film structure (for example, a structure may be applied to an electroluminescent display panel). The film structure includes a substrate 11, a first organic layer 12 disposed on the substrate 11, and a first additional layer 13 disposed on the first organic layer 12. Wherein, the first organic layer 12 has a sloped edge SE, and a climbing angle (an arc tangent of the height difference between the sloped edge SE and the substrate 11 and a projection of the sloped edge on the substrate 11, which is in radians and can be converted to an angle value) between the sloped edge and the substrate 11 is smaller than a breakable angle. In some embodiments, the first organic layer 12 may be an organic layer having the outer edge closest to the edge of the substrate 11 in the film structure.

In the embodiments of the present disclosure, the substrate 11 may be a rigid substrate or a flexible substrate.

As shown in FIG. 1, the schematic diagram on the left side is a partial enlarged view of the area A (the position of the dotted circle) in the film structure, the climbing angle between the upper surface UP of the first organic layer 12 and the substrate 11 is θ. F1 is one of the stresses on the first additional film layer 13 disposed on the first organic film layer 12. The direction of the stress F1 is parallel to the substrate 11. F2 is another stress on the first additional layer 13. The direction of the stress F2 is parallel to the tangential direction of the upper surface of the first organic layer 12 at the corner position. F is the resultant force of the stress F1 and the stress F2. According to the parallelogram rule, $F^2 = F1^2 + F2^2 - 2F1F2 \cos \theta$. When the stress F1 and the stress F2 are constant, the resultant force F increases as the climbing angle θ increases. The first additional layer 13 is more likely to crack when the resultant force F is larger. Therefore, the climbing angle of the first organic film layer 12 and the substrate 11 should be controlled to be smaller than the breakable angle to reduce the resultant force F of the first additional layer 13 formed on the first organic layer 12 at the corner position, so that the crack of the first addition layer 13 can be prevented.

When the stress F1 and the stress F2 are equal, it can be inferred that $F = 2F1 \sin(\theta/2)$, and the resultant force F also increases as the climbing angle θ increases.

It should be noted that the breakable angle refers to an angle at which the first additional layer formed on the sloped edge of the first organic layer cracks or is about to crack. Here, "is about to crack" means an increase in the probability of occurrence of crack as compared with less than the breakable angle. When the climbing angle θ is greater than or equal to the breakable angle, the first additional layer 13 may crack, or the probability of crack may increase. The climbing angle θ is an angle between the upper surface of the first organic layer 12, at the corner position, and the substrate 11.

Furthermore, the film structure of the embodiments of the present disclosure may include a plurality of organic layers. The first organic layer 12 may be an organic layer having an outer edge closest to the edge of the substrate 11 in the film structure. In some embodiments, the functional layer may be the functional layer in the functional structure on the substrate or an encapsulation layer in an encapsulation structure for encapsulating the functional structure. The functional structure is a structure that implements, for example, a display function. For example, the functional structure may include a pixel defining layer, a cathode, an organic light emitting layer, an anode, a planarization layer, and the like. In some embodiments, the first organic layer includes a planarization layer or a pixel defining layer.

In some embodiments, the first additional layer may include a first inorganic layer. In such case, the first additional layer 13 in FIG. 1 may be the first inorganic layer. Since the first inorganic layer has extremely low water oxygen permeability, with relatively large stress, high hardness, the crack is easily to occur, especially at the corner position of the first inorganic layer profile. Therefore, it is necessary to control the climbing angle between the first organic layer and the substrate to be smaller than the breakable angle, so that the first inorganic layer is less likely to crack. Therefore, water oxygen can be effectively prevented from entering into the inside of the functional structure, such as the OLED device, from the crack position.

Of course, the first additional layer 13 in FIG. 1 may be an organic layer. By controlling the climbing angle of the first organic layer 12 and the substrate 11, the cracking of the first additional layer 13 can also be prevented.

In the embodiments of the present disclosure, the specific value of the breakage angle is related to the material, preparation process, and film thickness of the first additional layer 13 which is subsequently formed. In an embodiment, the break angle is about 35°. When the climbing angle is greater than or equal to about 35°, the first additional layer 13 is more likely to crack. Therefore, the climbing angle can be set to be less than about 35° to prevent crack of the first additional layer 13. As used herein, "about" indicates a reasonable difference between an actual value and a desired value. For example, "about" may refer to a range of the desired value ±5°.

As shown in FIG. 1, the film structure further includes a protective layer 15 disposed opposite to the substrate 11 and an adhesive 14 for bonding the protective layer 15 and the substrate 11. The first organic layer 12 is located between the substrate 11 and the protective layer 15. The adhesive may be sheet glue or Dam-Filler (epoxy resin+getter filler) glue.

It should be noted that the first additional layer 13 formed on the first organic layer 12 is also located between the substrate 11 and the protective layer 15.

Next, the first additional layer 13 formed on the first organic layer 12 will be described as the first inorganic layer.

Figure 2:
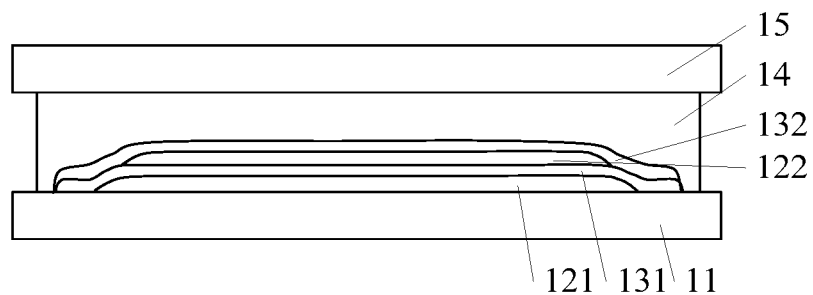
FIG. 2 shows a second schematic view of a film structure according to embodiments of the present disclosure.

FIG. 2, which shows a second schematic view of a film structure in some embodiments of the present disclosure, will be referred.

In an embodiment of the present disclosure, the first organic layer 121 is a functional layer in a functional structure. As shown in FIG. 2, the first organic layer 121 is disposed on the substrate 11, and the first inorganic layer 131 is covered on the first organic layer 121. At least one stack, consisting of the second organic layer 122 and the second inorganic layer 132, is disposed on the first inorganic layer 131. The second organic layer 122 is an organic layer in an encapsulation structure.

As shown in FIG. 2, compared with the second organic layer 122, the first organic layer 121 has an outer edge closer to the edge of the substrate 11. That is, the distance between the outer edge of the first organic film layer 121 and the edge of the substrate 11 is smaller than the distance between the outer edge of the second organic film layer 122 and the edge of the substrate 11. The climbing angle between the first organic layer 121 and the substrate 11 is set to be smaller than the breakable angle, and thus the crack of the first inorganic layer 131 can be prevented.

When the number of layers of the stack structure of the second organic layer 122 and the second inorganic layer 132 is increased, the ability to block water and oxygen can be further improved. In some embodiments, just the climbing angle between the first organic layer 121 and the substrate 11 may be set to be smaller than the breakable angle. In some embodiments, the climbing angle between the second organic layer 122 and the substrate 11 can also be set to be smaller than the breakable angle. Thus, the cracking of the second inorganic layer 132 can be prevented, and the ability to block water or oxygen can be further improved.

In an embodiment, the fabrication process of the OLED device includes forming a driving TFT (Thin Film Transistor) on the substrate, and then sequentially forming a planarization layer, an anode, a pixel defining layer, a light emitting layer, a cathode, and then performing encapsulating to complete the fabrication of OLED devices. The structure formed before the formation of the light-emitting layer is generally referred to as a back-plate structure, and the structure finally formed after the encapsulating is referred to as an encapsulation structure.

The organic layer in the back-plate structure includes a planarization layer or a pixel defining layer. That is, the first organic layer 121 may be a planarization layer or a pixel defining layer. Of course, in some other processes, the pixel defining layer maybe fabricated after the light emitting layer is fabricated. For example, when the pixel defining layer is an organic layer having an outer edge closest to the edge of the substrate in the film structure, the climbing angle between the pixel defining layer and the substrate may be set to be smaller than the breakable angle.

It should be noted that, in order to simplify the schematic view of FIG. 2, the driving TFT, the anode, the light-emitting layer, and the cathode are not shown in the drawing. However, it should be understood that, in the embodiments, when the first organic layer 121 is a planarization layer, a driving TFT should be disposed between the first organic layer 121 and the substrate 11. An anode, a pixel defining layer, a light emitting layer, and a cathode are further disposed between the first organic layer 121 and the first inorganic layer 131. In some embodiments, when the first organic layer 121 is a pixel defining layer, a driving TFT, a planarization layer, and an anode should be disposed between the first organic layer 121 and the substrate 11, and a light emitting layer and a cathode are further disposed between the first organic layer 121 and the first inorganic layers 131.

In some embodiments, on the laminated structure of the second organic layer 122 and the second inorganic layer 132, a protective layer 15 is disposed opposite to the substrate 11. The protective layer 15 is attached to the substrate 11 by an adhesive layer 14.

Figure 3:
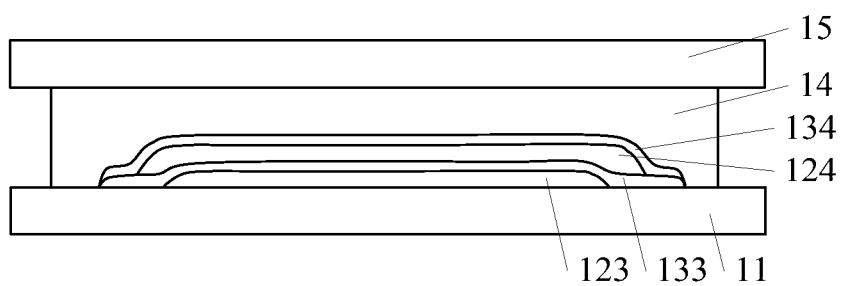
FIG. 3 shows a third schematic view of a film structure according to embodiments of the present disclosure.

FIG. 3, which shows a third schematic view of a film structure in an embodiment of the present disclosure, will be referred to.

In another embodiment, when the first organic layer 124 is an encapsulation layer in an encapsulation structure, the encapsulation structure includes at least one stack consisting of the first organic layer 124 and the first inorganic layer 134. The first inorganic layer 134 is overlaid on the first organic layer 124. A second organic layer 123 and a second inorganic layer 133 are further disposed between the first organic layer 124 and the substrate 11, wherein the second organic layer 123 may be an organic layer in the back-plate structure.

As shown in FIG. 3, compared with the second organic layer 123, the outer edge of the first organic layer 124 is closer to the edge of the substrate 11. The climbing angle between the first organic layer 124 and the substrate 11 is set to be smaller than the breakable angle, and the crack of the first inorganic layer 134 can be prevented.

Wherein, the organic layer in the back-plate structure includes a planarization layer or a pixel defining layer. That is, the second organic layer 123 may be a planarization layer or a pixel defining layer.

Further, on the stack structure of the first organic layer 124 and the first inorganic layer 134, a protective layer 15 is disposed opposite to the substrate 11. The protective layer 15 may be attached to the substrate 11 by an adhesive layer 14.

In embodiments of the present disclosure, a first organic layer having a sloped edge is disposed on a substrate, and a climbing angle between the sloped edge and the substrate is smaller than the breakable angle. By controlling the climbing angle between the first organic film layer and the substrate to less than the breakable angle, a climbing slope angle of the first additional layer subsequently disposed on the first organic film layer (an angle between the upper surface thereof and the substrate) is decreased. The resultant force of stresses in two directions, on the subsequently formed layer at the corner position, will be reduced. Therefore, the subsequently formed layer will be prevented from cracking and the service life of the functional structure (for example, an OLED device) will be improved.

Figure 5:
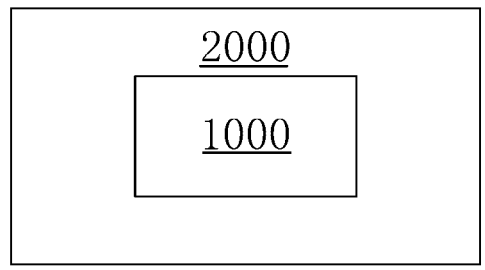
FIG. 5 is a schematic view of a display device according to embodiments of the present disclosure.

Embodiments of the present disclosure also provide a display device including the above-described film structure. FIG. 5 is a schematic view of a display device according to embodiments of the present disclosure. As shown in FIG. 5, the display device 2000 includes a film structure 1000. The film structure 1000 may be the film structure shown in FIGS. 1-3. This film structure can be applied to an electroluminescence display panel. The electroluminescent display panel includes a substrate, a first organic layer disposed on the substrate, and a first additional layer disposed on the first organic layer. The first organic layer has a sloped edge, and a climbing angle between the sloped edge and the substrate is smaller than a breakable angle. The breakable angle refers to an angle at which the first additional layer disposed on the sloped edge of the first organic layer cracks or is about to crack. In some embodiments, the first organic layer is an organic layer having an outer edge closest to the edge of the substrate in the film structure.

In some embodiments, the breakable angle is about 35°. The first organic layer may be an organic layer in a functional structure or an organic layer in an encapsulation structure. A first inorganic layer may be disposed on the first additional layer may.

In embodiments of the present disclosure, the first organic layer is a functional layer in the functional structure, and the film structure further includes at least one stack, consisting of a second organic layer and a second inorganic layer, on the first inorganic layer.

In embodiments of the present disclosure, the first organic layer is an encapsulation layer in an encapsulation structure. The encapsulation structure includes at least one stack consisting of the first organic layer and the first inorganic layer.

In some embodiments, the first organic layer includes a planarization layer or a pixel defining layer. The substrate may be a rigid substrate or a flexible substrate.

In some embodiments, the film structure further includes a protective layer disposed opposite to the substrate and an adhesive layer bonding the protective layer and the substrate, wherein the first organic layer is located between the substrate and the protective layers.

In embodiments of the present disclosure, the display device includes a film structure including a first organic layer having a sloped edge on the substrate (for example, the first organic layer is an organic film layer in the film layer structure of which the outer edge is closest to the edge of the substrate). The climbing angle between the first organic layer and the substrate (i.e., the angle between the tangent plane of the upper surface of the sloped edge and the substrate) is less than the breakable angle. By controlling the climbing angle between the first organic film layer and the substrate to less than the breakable angle, a climbing slope angle of the first additional layer subsequently disposed on the first organic film layer (an angle between the upper surface of the first additional layer and the substrate) is decreased. The resultant force of stresses in two directions, on the subsequently formed layer at the corner position, will be reduced. Therefore, the subsequently formed layer will be prevented from cracking and the service life of the functional structure (for example, an OLED device) will be improved.

Figure 4:
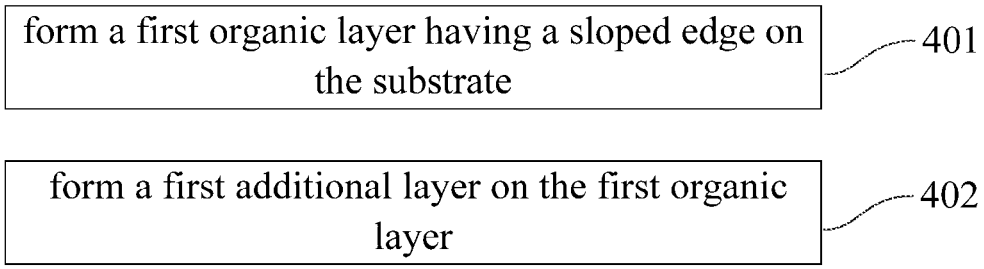
FIG. 4 is a flow chart showing a method of fabricating a film structure according to embodiments of the present disclosure.

FIG. 4 which shows a flow chart of a method for fabricating a film structure in embodiments of the present disclosure will be referred to. The method includes:

Step 401, forming a first organic layer on the substrate.

In the embodiments of the present disclosure, the first organic layer is on the substrate, and the method of fabricating the first organic layer differs depending on the type of the first organic layer.

Step 402, forming a first additional layer on the first organic layer. Wherein the first organic layer has a sloped edge, and an angle between a tangent plane of the upper surface of the sloped edge and the substrate is less than a breakable angle. The breakable angle refers to an angle at which the first additional layer on the sloped edge of the first organic layer cracks or is about to crack.

For example, in consideration of an encapsulation effect, the first organic layer may be an organic layer, among the film structure, having an outer edge closest to the edge of the substrate. The climbing angle between the first organic layer and the substrate is smaller than the breakable angle.

Referring to FIG. 2, when the first organic layer 121 is an organic layer in a functional structure, the first organic layer 121 may be formed using an exposure and development process. By adjusting parameters such as exposure intensity, exposure time, developer concentration, development time, and the like, the climbing angle between the first organic layer 121 and the substrate 11 is set to smaller than the breakable angle.

Referring to FIG. 3, when the first organic layer 124 is an organic layer in an encapsulation structure, the first organic layer 124 may be formed by a printing process or a chemical vapor deposition process. The climbing angle between the first organic layer 124 and the substrate 11 is made smaller than the breakable by adjusting the material viscosity of the first organic layer, the contact angle of the substrate, the deposition rate of the first organic layer, and the like. In the case of the first organic layer 124 is an organic layer in an encapsulation structure, specific steps of forming a first organic layer on the substrate may include forming a second organic layer on the substrate, forming a second inorganic layer on the second organic layer, and forming the first organic layer on the second inorganic layer.

In some embodiments, first, the second organic layer 123 is formed on the substrate 11 by an exposure and development process. Then, a second inorganic layer 133 is formed on the second organic layer 123 by a chemical vapor deposition process or an atomic layer deposition process. Finally, the first organic layer 124 is formed on the second inorganic layer 133 by a printing process or a chemical vapor deposition process.

In some embodiments of the present disclosure, after the first organic layer is formed on the substrate, the first inorganic layer may be formed on the first organic layer. The first inorganic layer may be formed using a chemical vapor deposition process or an atomic layer deposition process.

Referring to FIG. 2, in some embodiments of the present disclosure, when the first organic layer 121 is an organic layer in a functional structure, a chemical vapor deposition process or an atomic layer deposition process may be employed to form a first inorganic layer 131 on the first organic layer 121.

In some embodiments of the present disclosure, the first organic layer 121 is an organic layer in a functional structure. After the first inorganic layer is formed on the first organic layer, at least one stack, consisting of a second organic layer and a second inorganic layer, is formed on the first inorganic layer.

A second organic layer 122 is formed (for example, using a printing process or a chemical vapor deposition process) on the first inorganic layer 131. The second inorganic layer 132 is formed (for example, using a chemical vapor deposition process or an atomic layer deposition process) on the second organic layer 122. The stack structure of the second organic layer 122 and the second inorganic layer 132 may be formed in accordance with the above-described process. The number of layers of the stack structure is greater than or equal to one.

In some embodiments, after forming the stack structure of the second organic layer 122 and the second inorganic layer 132, shellac glue may be applied to or a Dam-Filler adhesive may be coated on the second inorganic layer 132 in the stack structure to form an adhesive layer 14. A protective layer 15 may be attached to the adhesive 14.

Referring to FIG. 3, when the first organic layer 124 is an organic layer in an encapsulation structure, a first inorganic film is formed on the first organic layer 124 (for example, by a chemical vapor deposition process or an atomic layer deposition process).

In some embodiments, a sheet of glue or a Dam-Filler adhesive is applied to the first inorganic layer 134 to form an adhesive layer 14. A protective layer 15 is attached to the adhesive layer 14.

The material of the first inorganic layer and the second inorganic layer may include at least one of $SiN_x$ (silicon nitride), SiCN (silicon carbonitride), SiON (silicon oxynitride), and $Al_2O_3$ (alumina).

In embodiments of the present disclosure, a first organic layer (for example, the first organic layer is an organic layer, among the layers in the film structure, with an outer edge closest to the edge of the substrate) having a sloped edge is disposed on a substrate, and an angle between a tangent plane of the upper surface of the sloped edge and the substrate (also referred to as "climbing angle") is smaller than the breakable angle. The breakable angle is an angle at which the first additional layer on the sloped edge of the first organic layer cracks or is about to crack. By controlling the climbing angle between the first organic film layer and the substrate to less than the breakable angle, a climbing slope angle of the layer subsequently formed on the first additional layer will be decreased. Thus, the resultant force of stresses in two directions, on the subsequently formed layer at the corner position, will be reduced. Thus, the subsequently formed layer will be prevented from cracking and the service life of the functional structure (for example, an OLED device) will be improved.

For the foregoing method embodiments, for the sake of brief description, they are all expressed as a series of action combinations. However, those skilled in the art should understand that the present disclosure is not limited by the described action sequence, because, according to the present disclosure, some steps can be performed in other orders or at the same time. Besides, those skilled in the art should also understand that the embodiments described in the specification are preferred embodiments, and the actions and modules involved are not necessarily required by the present disclosure.

The various embodiments in the present disclosure are described in a progressive manner. Each embodiment focuses on differences from other embodiments, and the same similar parts between the various embodiments can be referred to each other.

Finally, it should also be noted that in this context, relational terms such as first and second are used merely to distinguish one entity or operation from another entity or operation, and do not necessarily require or imply there is any such actual relationship or order between these entities or operations. Furthermore, the terms "comprises" or "comprising" or "including" or any other variations are intended to encompass a non-exclusive inclusion, such that processes, methods, articles, or device that include a set of elements include not only those elements, but also other elements that are not explicitly listed, or include elements inherent to such a process, method, article, or equipment. In the absence of more restrictions, elements defined by the phrase "including one . . . " do not exclude the existence of additional identical elements in the process, method, article, or device that includes the element.

The method for fabricating a film structure, a display device and a film structure according to the present disclosure has been described in detail above. The principle and implementation of the present disclosure are described in the following by using specific examples. The above description of the embodiments is only for assisting in understanding the method of the present disclosure and its core ideas. At the same time, for those of ordinary skill in the art, depending on the idea of the present disclosure, there will be changes in specific embodiments and applications. The description herein is not to be construed as limiting the disclosure.

What is claimed is:

1. A film structure comprising:
    a first organic layer disposed on the substrate, wherein the first organic layer is of a single layer structure, and wherein the first organic layer is a functional layer in a functional structure on the substrate;
    a first additional layer disposed on the first organic layer, wherein the first additional layer comprises a first inorganic layer, wherein the first organic layer has a sloped edge, wherein a climbing angle between the sloped edge and the substrate is less than a first breakable angle, and wherein the first breakable angle is an angle at which the first additional layer on the sloped edge of the first organic layer cracks or is about to crack; and
    at least one stack consisting of a second organic layer and a second inorganic layer on the first inorganic layer, wherein a climbing angle between the second organic layer and the substrate is less than a second breakable angle, and wherein the second breakable angle is an angle at which the second inorganic layer on the second organic layer cracks or is about to crack.

2. The film structure according to claim 1, wherein the first breakable angle is about 35°.

3. The film structure according to claim 1, wherein the first organic layer comprises one of a planarization layer and a pixel defining layer.

4. The film structure according to claim 1, further comprising a protective layer disposed opposite to the substrate and an adhesive layer for bonding the protective layer to the substrate, wherein the first organic layer is located between the substrate and the protective layer.

5. The film structure according to claim 1, wherein the substrate is one of a rigid substrate and a flexible substrate.

6. A display device comprising the film structure according to claim 1.

7. A method for fabricating a film structure, the method comprising:
    forming a first organic layer on the substrate, wherein the first organic layer is of a single layer structure, and wherein the first organic layer is a functional layer in a functional structure on the substrate;
    forming a first additional layer on the first organic layer, wherein the first additional layer comprises a first inorganic layer, wherein the first organic layer has a sloped edge, wherein a climbing angle between the sloped edge and the substrate is less than a first breakable angle, and wherein the first breakable angle is an angle at which the first additional layer formed on the sloped edge of the first organic layer cracks or is about to crack; and
    forming at least one stack consisting of a second organic layer and a second inorganic layer on the first inorganic layer, wherein a climbing angle between the second organic layer and the substrate is less than a second breakable angle, and wherein the second breakable angle is an angle at which the second inorganic layer on the second organic layer cracks or is about to crack.

8. A display device comprising the film structure according to claim 2.

9. A display device comprising the film structure according to claim 3.

* * * * *